(12) United States Patent
Kawase et al.

(10) Patent No.: US 8,695,294 B2
(45) Date of Patent: Apr. 15, 2014

(54) REINFORCED CONCRETE PARTITION BODY

(75) Inventors: Takaharu Kawase, Tokyo (JP); Junichi Tanoi, Tokyo (JP)

(73) Assignee: Tokyu Construction Co., Ltd., Tokyo (JP)

(*) Notice: Subject to any disclaimer, the term of this patent is extended or adjusted under 35 U.S.C. 154(b) by 0 days.

(21) Appl. No.: 13/580,695

(22) PCT Filed: Feb. 23, 2010

(86) PCT No.: PCT/JP2010/052711
§ 371 (c)(1),
(2), (4) Date: Aug. 23, 2012

(87) PCT Pub. No.: WO2011/104810
PCT Pub. Date: Sep. 1, 2011

(65) Prior Publication Data
US 2012/0324811 A1     Dec. 27, 2012

(51) Int. Cl.
*E04C 5/08* (2006.01)
(52) U.S. Cl.
USPC ............. 52/223.6; 52/144; 52/414; 52/649.1
(58) Field of Classification Search
USPC ............. 52/144, 145, 223.6, 414, 649.1; 181/210, 284–286, 290
See application file for complete search history.

(56) References Cited

U.S. PATENT DOCUMENTS

| | | | | |
|---|---|---|---|---|
| 5,406,039 A | * | 4/1995 | Rerup et al. | 181/210 |
| 6,470,640 B2 | * | 10/2002 | Ytterberg | 52/414 |
| 2001/0023568 A1 | * | 9/2001 | Edwards et al. | 52/649.1 |
| 2004/0098934 A1 | * | 5/2004 | Lawson et al. | 52/270 |
| 2008/0083181 A1 | * | 4/2008 | Ospina | 52/334 |

FOREIGN PATENT DOCUMENTS

| | | | | |
|---|---|---|---|---|
| JP | 02-091997 A | | 3/1990 | |
| JP | 4-167602 A | | 6/1992 | |
| JP | 5-003394 A | | 1/1993 | |
| JP | 5-021983 A | | 1/1993 | |
| JP | 05003394 A | * | 1/1993 | ............... H05K 9/00 |
| JP | 5-267880 A | | 10/1993 | |
| JP | 9-214168 A | | 8/1997 | |

(Continued)

OTHER PUBLICATIONS

International Search Report w/translation from PCT/JP2010/052711 mailed Apr. 20, 2010 (4 pages).

(Continued)

*Primary Examiner* — Brian Glessner
*Assistant Examiner* — Adam Barlow
(74) *Attorney, Agent, or Firm* — Osha Liang LLP (57) ABSTRACT

Provided is a reinforced concrete partitioning structure that can exhibit electromagnetic shield function against an electromagnetic wave at target frequency. It includes an RC wall to attenuate an electromagnetic wave at target frequency propagating from an inner space to an outer space, a concrete portion having a thickness in a direction from the inner space to the outer space, and a front reinforcing bar lattice which forms a reinforcing bar plane in lattice at a position along the thickness of the concrete portion. The front reinforcing bar lattice has a plurality of longitudinal bars arranged at fixed spacing, and a plurality of transverse bars arranged at fixed spacing to intersect the longitudinal bars. The spacings of the longitudinal bars and transverse bars are adjusted according to the wavelength of an electromagnetic wave at the target frequency.

20 Claims, 9 Drawing Sheets (56) References Cited

FOREIGN PATENT DOCUMENTS

| | | |
|---|---|---|
| JP | 11-121973 A | 4/1999 |
| JP | 2002-013223 A | 1/2002 |
| JP | 2002-054248 A | 2/2002 |
| JP | 2002-151885 A | 5/2002 |
| JP | 2008-004901 A | 1/2008 |

OTHER PUBLICATIONS

Office Action in corresponding Japanese Application No. 2012-501549 mailed on Sep. 10, 2013 (2 pages).

* cited by examiner

REINFORCED CONCRETE PARTITION BODY

TECHNICAL FIELD

One or more embodiments of the present invention relates to a reinforced concrete partitioning structure such as a wall or a floor made from reinforced concrete between two spaces so as to attenuate the propagation of electromagnetic waves.

BACKGROUND ART

In related art, Patent Documents 1 and 2 disclose a building with an electromagnetic wave shield function to prevent unnecessary electromagnetic waves from penetrating into the building from outside or leaking from inside to outside. The electromagnetic waves having entered the building from outside may cause image blurs on TVs and personal computers or the malfunctioning of electronic devices. Also, the electromagnetic waves arising from radio transmission inside the building may propagate to outside, which may cause leakage of information.

Meanwhile, the walls and floors of a building and the like are generally made from reinforced concrete, and reinforced concrete is built to satisfy only required load bearing as a structure so that it exhibits a low electromagnetic wave shielding function. Especially, the electromagnetic waves at frequency of a short wavelength of 1 GHz or more mostly penetrate through reinforced concrete walls.

In view of this, a building having electromagnetic wave shield function is realized by attaching an electromagnetic wave shielding member such as iron plate, metal wire, metallic foil, metal mesh onto the surfaces of walls and floors, for example.

Patent Document 1: Japanese Patent Application Publication No. 11-121973
Patent Document 2: Japanese Patent Application Publication No. 2002-54248

SUMMARY OF THE INVENTION

Attaching an electromagnetic wave shielding member adds another member to a reinforced concrete structure, which adds up material costs and the work process for attaching the electromagnetic wave shield member.

Further, only the electromagnetic waves at a specific frequency may need to be shielded, for example, when the radio waves of a mobile phone should be received inside the building but the radio waves of wireless LAN (Local Area Network) should not be leaked to outside.

One or more embodiments of the present invention provides a reinforced concrete partitioning structure which can exert shielding function against electromagnetic waves with a target frequency.

A reinforced concrete partitioning structure according to one or more embodiments of the present invention attenuates an electromagnetic wave at a target frequency which propagates from one space to the other space. The structure includes a concrete portion having a thickness in a direction of the one space to the other space, and a reinforcing bar portion to form a reinforcing bar plane in lattice at a position in the thickness direction of the concrete portion, wherein the reinforcing bar portion includes a plurality of first reinforcing bars arranged with a fixed spacing and a second reinforcing bars arranged with a fixed spacing to intersect the first reinforcing bars, and the spacings of the first and second reinforcing bars are adjusted according to a wavelength or frequency of the electromagnetic wave at the target frequency.

According to one or more embodiments, the spacings of the first and second reinforcing bars are adjusted according to a frequency of an electromagnetic wave which causes resonance inside the concrete portion.

Further, in one or more embodiments, the position of the reinforcing bar portion in the thickness direction is set according to an integral multiple of a wavelength of the target frequency inside the concrete portion or a wavelength obtained by subtracting a half wavelength from the integral multiple of the wavelength.

In thus configured reinforced concrete partitioning structure according to one or more embodiments of the present invention, the reinforcing bar portion is embedded inside the concrete portion and formed of first reinforcing bars and second reinforcing bars in lattice. Then, the spacings between the first and second reinforcing bars are adjusted according to the wavelength or frequency of the electromagnetic wave at the target frequency in order to attenuate the electromagnetic wave at the target frequency.

Because of this, the reinforced concrete partitioning structure built as a necessary structure can shield electromagnetic waves at the target frequency by itself.

DETAILED DESCRIPTION

Hereinafter, one or more embodiments of the present invention will be described in detail with reference to the accompanying drawings.

Figure 1:
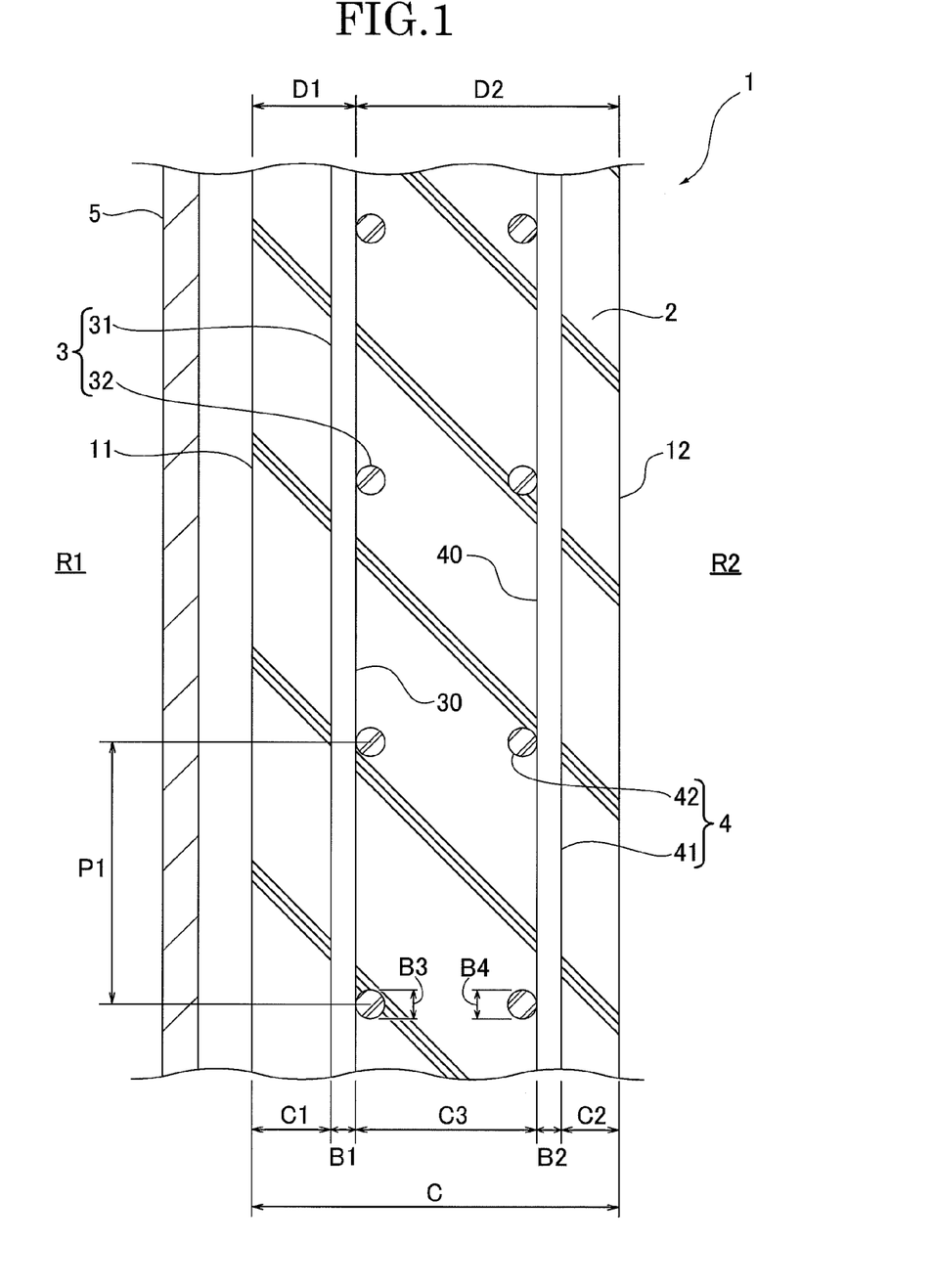
FIG. 1 is a cross section view of a reinforced concrete partitioning structure according to one or more embodiments of the present invention.

FIG. 1 shows an RC wall 1 as a reinforced concrete partitioning structure according to the present embodiment which functions to separate an inner space R1 of a building as one space and an outer space R2 thereof as the other space. The RC wall 1 is provided to shield the propagation of an electromagnetic wave with a target frequency from the inner space R1 to the outer space R2 of the building or from the outer space R2 to the inner space R1. Herein, "shield" refers to obtaining electromagnetic wave shielding effect (SE: Shielding effectiveness) by attenuating the propagation of electromagnetic waves.

First, the structure of the RC wall 1 is described with reference to FIGS. 1 and 2. The RC wall 1 in FIGS. 1 and 2 comprises a concrete portion 2 in thickness C, a front reinforcing bar lattice 3 as a reinforcing bar portion embedded in the inner space R1 of the concrete portion 2, and a rear reinforcing bar lattice 4 as a reinforcing bar portion embedded in the outer space R2 in parallel to the front reinforcing bar lattice 3.

The concrete portion 2 is produced by mixing cement, aggregate, and water, for example. The mixture of the concrete portion 2 should be set to satisfy required strength of the RC wall 1.

The surface of the concrete portion 2 on an inner space R1 side is a front surface 11 while that on an outer space R2 side is a rear surface 12. As shown in the cross section view of FIG. 1, an interior plate 5 is arranged approximately in parallel to the front surface 11 with a spacing in a direction of the inner space R1.

Figure 2:
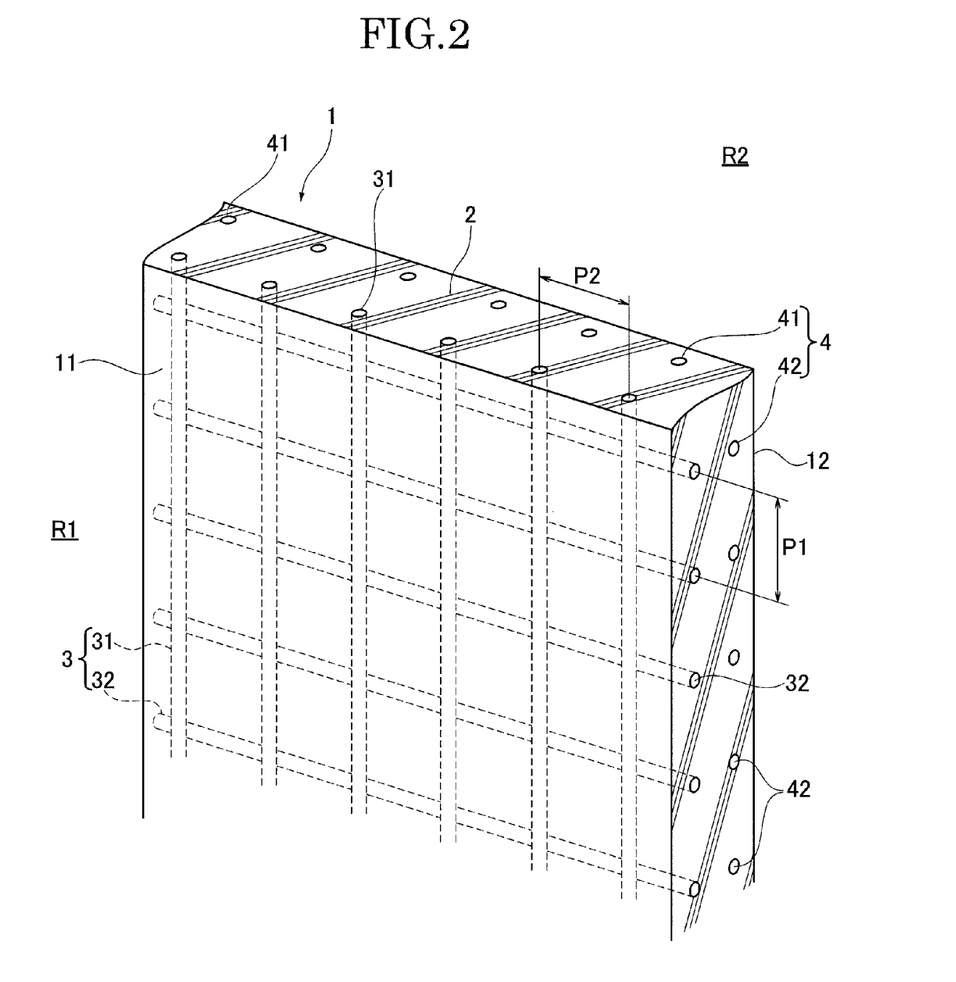
FIG. 2 is a perspective view of the structure of the reinforced concrete partitioning structure according to one or more embodiments of the present invention.

Further, the front reinforcing bar lattice 3 in FIG. 2 is formed in lattice of longitudinal bars 31, . . . as first reinforcing bars vertically standing and transverse bars 32, . . . as second reinforcing bars intersecting the longitudinal bars 31 at about right angle. The longitudinal bars 31, . . . and transverse bars 32, . . . are arranged with fixed spacings and the plane on which the longitudinal bars 31, . . . and transverse bars 32, . . . abut on each other is a reinforcing bar plane 30.

Further, the transverse bars 32, 32 and longitudinal bars 31, 31 are both arranged approximately in parallel with fixed spacings. The distance between the transverse bars 32, 32 is defined as spacing P1 and that between the longitudinal bars 31, 31 is defined as spacing P2, and the spacings P1 (P2) among all the transverse bars 32, 32 (longitudinal bars 31, 31) are equal. Hereinafter, when the spacings P1 and P2 are equal, they may be collectively referred to as lattice spacing.

Further, in FIG. 1 the diameter of the longitudinal bars 31 is defined as bar diameter B1 while that of the transverse bars 32 is defined as bar diameter B3. The distance between the longitudinal bars 31 and the front surface 11 of the concrete portion 2 is defined as cover thickness C1. The distance between the front surface 11 and the reinforcing bar plane 30 is defined as distance D1 while that between the reinforcing bar plane 30 and the rear surface 12 is defined as distance D2.

Similarly to the front reinforcing bar lattice 3, the rear reinforcing bar lattice 4 is formed in lattice of longitudinal bars 41, . . . as first reinforcing bars vertically standing and transverse bars 42, . . . as second reinforcing bars intersecting the longitudinal bars 41 at about right angle. The longitudinal bars 41, . . . and transverse bars 42, . . . are arranged with fixed spacings and the plane on which the longitudinal bars 41, . . . and transverse bars 42, . . . abut on each other is a reinforcing bar plane 40. The spacing between the reinforcing bar plane 30 of the front reinforcing bar lattice 3 and the reinforcing bar plane 40 along the thickness of the concrete portion 2 is set to distance C3.

Further, the distance between the transverse bars 42, 42 and that between the longitudinal bars 41, 41 are set to spacing P1, P2, respectively, and all the spacings between the transverse bars 42, 42 (longitudinal bars 41, 41) are equal.

Moreover, as shown in FIG. 1, the diameter of the longitudinal bars 41 is set to bar diameter B2 while the diameter of the transverse bars 42 is set to bar diameter B4. The distance between the longitudinal bar 41 and the rear surface 12 of the concrete portion 2 is set to cover thickness C2.

Next, the analysis for investigating the electromagnetic wave shielding effect of the RC wall 1 according to the present embodiment is described with reference to FIG. 3 to FIG. 7.

Figure 3:
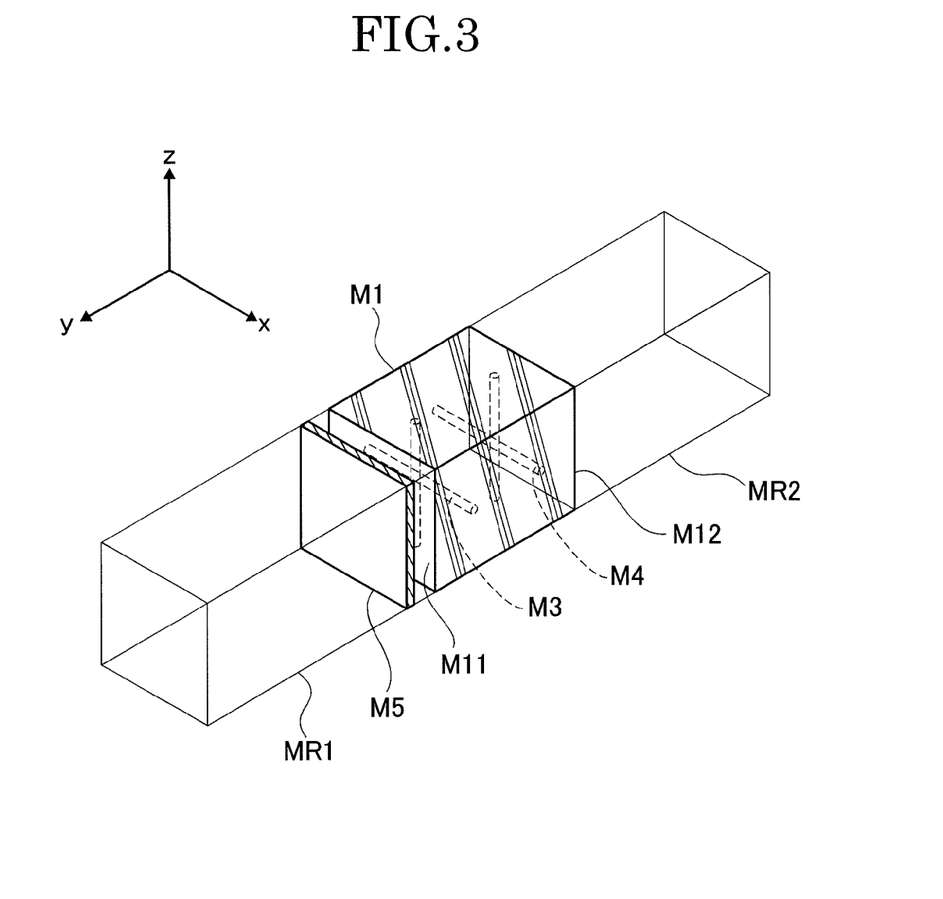
FIG. 3 shows an analysis model of the reinforced concrete partitioning structure to examine electromagnetic wave shielding effect thereof.

FIG. 3 shows a part of the analysis model used in numerical simulation by finite element method. In FIG. 3 an inner space model MR1 and an outer space model MR2 are placed on both sides of an RC wall model M1. An interior plate model M5 is formed in the RC wall M1 on the inner space MR1 side. Also, cross-like front and rear reinforcing bar lattice models M3, M4 are formed inside the RC wall M1. The surface of the RC wall M1 on the inner space R1 side is a front surface M11 while that on the outer space MR2 side is a rear surface M12.

Figure 4:
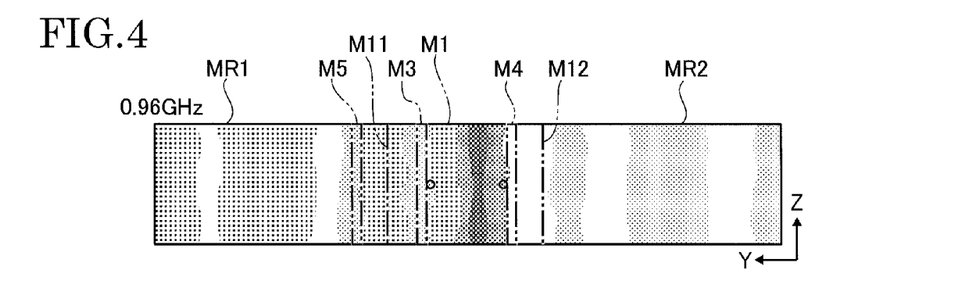
FIG. 4 shows a distribution in field intensity as a result of analysis.
Figure 5:
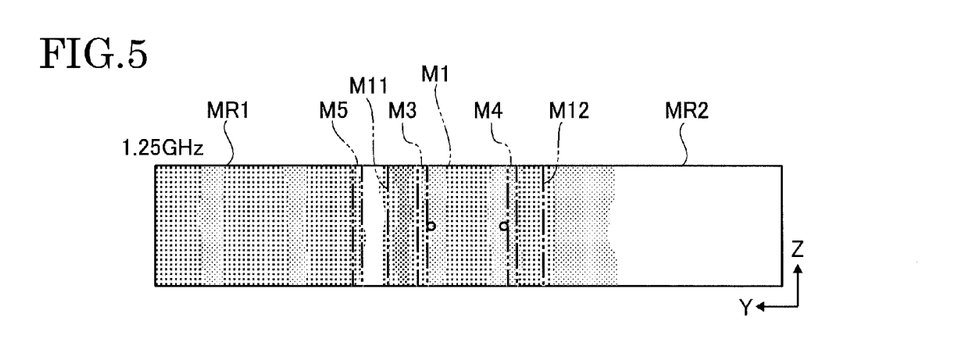
FIG. 5 shows a distribution in field intensity as a result of analysis.

According to this analysis, a planar wave of vertical polarization was propagated from the inner space MR1 to the RC wall M1 to examine the field intensity of an electromagnetic wave propagating to the outer space MR2. Further, the simulation in which the vertical polarization was changed in frequency of 0.5 GHz to 1.5 GHz in unit of 0.01 GHz was conducted. FIG. 4 and FIG. 5 show a distribution in field intensity seen laterally, to prove that high electromagnetic wave shielding effect of the RC wall M1 was acquired. In the drawings the portions with a relatively high field intensity are represented in dark color dots and the lower the field intensity, the lighter the color of the dots.

FIG. 4 shows a distribution in field intensity obtained from a simulation that a planar wave of vertical polarization at frequency of 0.96 GHz was propagated. As seen in FIG. 4, with the propagation of the electromagnetic wave at this frequency, the portion between the front and rear reinforcing bar lattices M3, M4 is high (dark color dots) in the field intensity due to standing waves therebetween. It is assumed that the standing waves were formed by interaction of multiple reflection of reflected waves which resulted from resonance between the front reinforcing bar lattice M3 and the rear surface 12 (in the distance D2 in FIG. 1). Further, the field intensity is very low (light color dots or white color) in the outer space MR2. This is assumedly because electromagnetic waves were attenuated by the resonance inside the RC wall M1 and prevented from propagating to the outer space MR2.

FIG. 5 shows a distribution in field intensity obtained from a simulation that a planar wave of vertical polarization at frequency of 1.25 GHz was propagated. As seen in FIG. 5, with the propagation of the electromagnetic wave at this frequency, the portion between the front surface 11 and the front reinforcing bar lattice M3 is high (dark color dots) in the field intensity due to standing waves formed therebetween. This is assumedly because resonance occurred between the front surface M11 of the RC wall M1 and the front reinforcing bar lattice M3 (in the distance D1 in FIG. 1).

Figure 6:
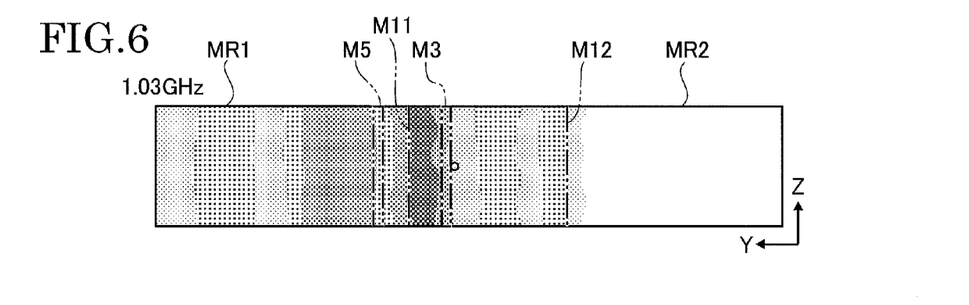
FIG. 6 shows a distribution in field intensity as a result of analysis.

Further, FIG. 6 shows a result of the analysis using a model in which only the front reinforcing bar lattice M3 is placed without the rear reinforcing bar lattice M4 in FIG. 3. As shown in FIG. 6, when a plane wave of vertical polarization at frequency of 1.03 GHz was propagated in this model, the portion between the front surface M11 and the front reinforcing bar lattice M3 is high (dark color dots) in the field intensity due to standing waves formed therebetween. This is assumedly because resonance occurred between the front surface M11 of the RC wall M1 and the front reinforcing bar lattice M3 (in the distance D1 in FIG. 1).

Figure 7:
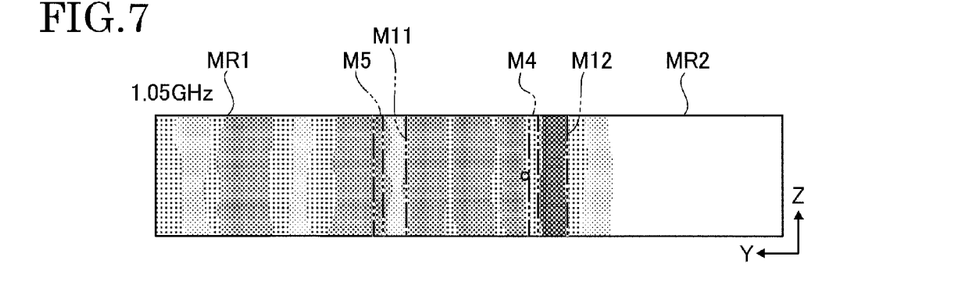
FIG. 7 shows a distribution in field intensity as a result of analysis.

Meanwhile, FIG. 7 shows a result of the analysis using a model in which only the rear reinforcing bar lattice M4 is placed without the front reinforcing bar lattice M3 in FIG. 3. As shown in FIG. 7, when a plane wave of vertical polarization at frequency of 1.05 GHz was propagated in this model, the portion between the rear surface M12 and the rear reinforcing bar lattice M4 is high (dark color dots) in the field intensity due to standing waves formed therebetween. This is assumedly because resonance occurred between the rear surface M12 of the RC wall M1 and the rear reinforcing bar lattice M4 (in the cover thickness C2+bar diameter B2 in FIG. 1).

Thus, it can be seen that at specific frequencies, resonance occurs inside the RC wall M1, thereby reducing a transmissive wave. Possible phenomena for contributing to the reduction of transmissive waves are resonance and phenomena other than resonance. Herein, these phenomena are collectively referred to as quasi-resonance phenomenon since at least resonance occurred.

Figure 8:
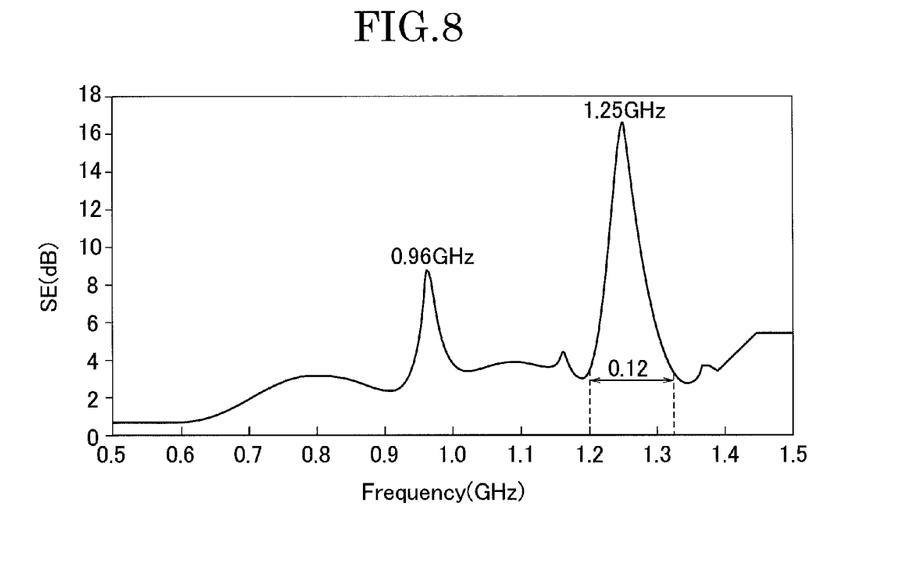
FIG. 8 is a graph showing a relation between frequency and electromagnetic wave shielding effect.

FIG. 8 shows the results of the above-mentioned analyses with frequency on the abscissa axis and electromagnetic wave shielding effect (SE) on the longitudinal axis. Herein, the electromagnetic wave shielding effect (SE) is expressed by decibel (dB) based on the ratio of field intensities obtained with or without the RC wall M1.

$$SE=20 \log_{10}(\text{field intensity with absence of the RC wall } M1/\text{that with presence of the RC wall } M1)$$

For example, the electromagnetic wave shielding effect (SE) of 20 dB signifies that the intensity of the electromagnetic wave is attenuated to one-tenth, that is 90% in shield rate.

In the graph in FIG. 8 the electromagnetic wave shielding effect (SE) exhibits a peak at 0.96 GHz and 1.25 GHz which are the frequencies at which the resonance occurred inside the RC wall M1 in FIGS. 4 to 5. That is, by the electromagnetic wave at frequency of 0.96 GHz, the resonance occurred between the front reinforcing bar lattice M3 and the rear surface M12 (in the distance D2 in FIG. 1), which resulted in large attenuation of the electromagnetic wave. Also, by the electromagnetic wave at frequency of 1.25 GHz, the resonance occurred between the front surface M11 of the RC wall M1 and the front reinforcing bar lattice M3 (in the distance D1=(cover thickness C1+bar diameter B1)), which resulted in large attenuation of the electromagnetic wave.

Note that FIG. 8 bases on the results of the analysis. However, actual measurement tests were conducted using a produced reinforced concrete wall and the same results as the analysis results were obtained. Thereby, the effectiveness of the analysis results was confirmed.

It can be understood from these results that the reinforcing bar plane 30 of the front reinforcing bar lattice 3 forms a semi-transmissive plane to reduce the transmissive wave of the electromagnetic wave. The resonance occurs because the reinforcing bar plane 30 as the semi-transmissive plane acts as a reflective face.

Figure 9:
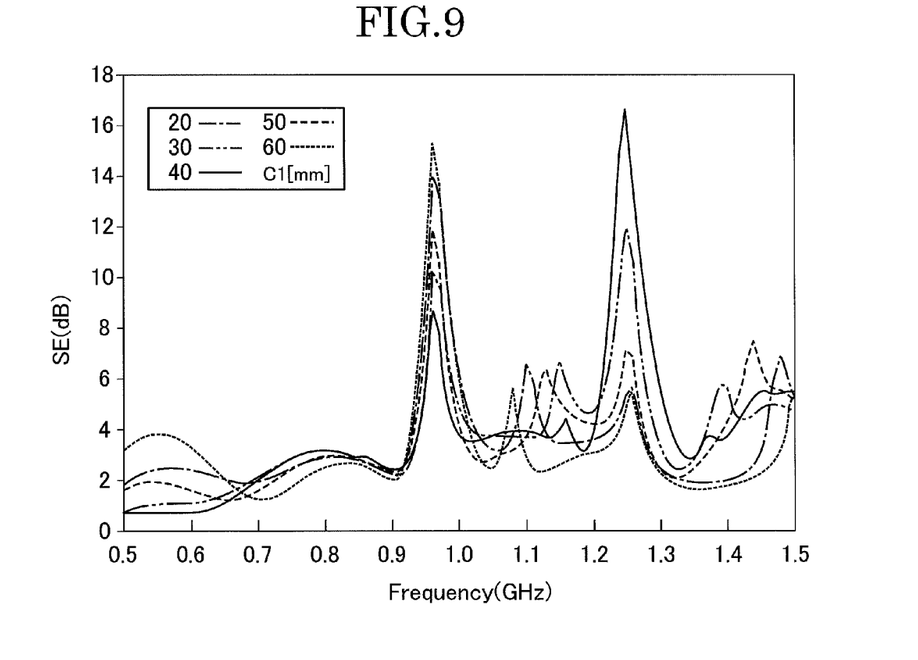
FIG. 9 is a graph showing a relation between frequency and electromagnetic wave shielding effect relative to the cover thickness of a plurality of reinforcing bar portions.

Thus, since the resonance occurs between the front reinforcing bar lattice M3 and the rear surface M12 or between the front reinforcing bar lattice M3 and the front surface M11, changing the position of the front reinforcing bar lattice M3 along the thickness of the RC wall M1 to change the distances D1, D2 will change the electromagnetic wave shielding effect (SE). FIG. 9 shows the analysis results when the cover thickness C1 of the front reinforcing bar lattice M3 is changed to 20 mm, 30 mm, 40 mm, 50 mm, and 60 mm in unit of 10 mm. Note that the analysis was conducted on the assumption that the bar diameter B1 is 10 mm and the thickness C of the RC wall M1 is 200 mm.

In FIG. 9 the result obtained when the cover thickness C1 is 40 mm in FIG. 8 is indicated by the solid line. The electromagnetic wave shielding effect (SE) of the RC wall at frequency 1.25 GHz exhibits a peak at the cover thickness C1=40 mm and it is reduced as the cover thickness C1 increases or decreases. Meanwhile, the electromagnetic wave shielding effect (SE) at frequency of 0.96 GHz is highest at the cover thickness C1 being 60 mm and lowest at the cover thickness C1 being 40 mm. However, although in different levels, the electromagnetic wave shielding effect (SE) at frequency 0.96 GHz and 1.25 GHz can be attained all over the cover thicknesses C1 of 20 mm to 60 mm.

Thus, the reinforcing bar plane 30 of the front reinforcing bar lattice 3 works as the semi-transmissive plane to reflect the electromagnetic wave and cause the resonance inside the RC wall 1. Thereby, the electromagnetic wave can be shielded. However, the front reinforcing bar lattice 3 does not reflect the electromagnetic wave depending on the spacing P1 of the transverse bars 32, 32 and the spacing P2 of the longitudinal bars 31, 31 in the front reinforcing bar lattice 3. In view of this, a relation between frequency and the lattice spacing (P1, P2) was investigated.

Figure 10:
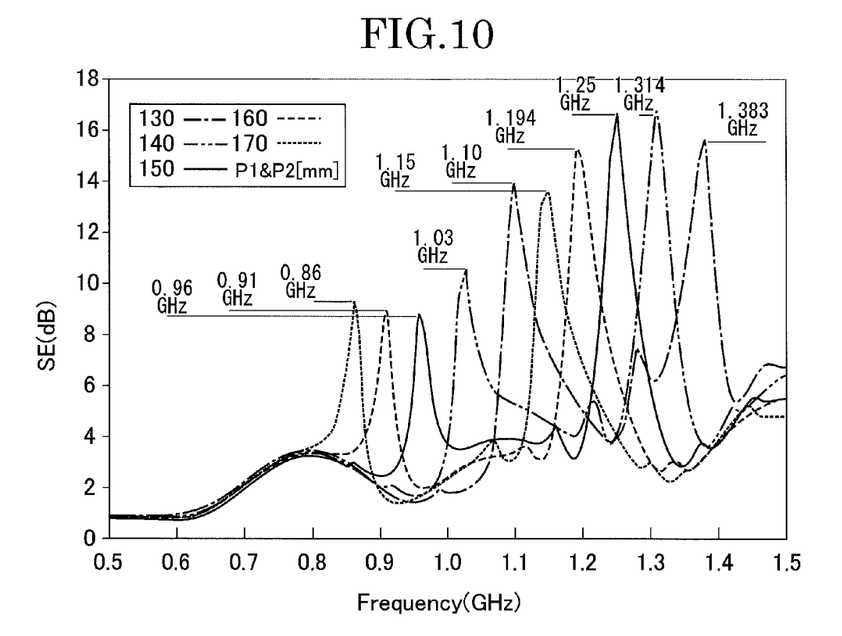
FIG. 10 is a graph showing a relation between frequency and electromagnetic wave shielding effect relative to a plurality of spacings of reinforcing bars.

FIG. 10 shows a relation between the frequency and the electromagnetic wave shielding effect (SE) when the lattice spacing (P1, P2) is changed to 130 mm, 140 mm, 150 mm, 160 mm and 170 mm in unit of 10 mm. In FIG. 10 the result obtained when the lattice spacing is 150 mm in FIG. 8 is indicated by the solid line. With the lattice spacing being smaller than this spacing indicated by the solid line, the peaks of the curves move rightward while with the lattice spacing being wider, they move leftward, as shown in FIG. 10. That is, the reinforcing bar plane with a smaller lattice spacing functions as a reflective face for electromagnetic waves with a higher frequency (shorter wavelength) and that with a larger lattice spacing functions as a reflective face for electromagnetic waves with a lower frequency (longer wavelength).

In view of this, the semi-transmissive plane to reduce the transmissive wave is formed by adjusting the lattice spacing (P1, P2) of the front or rear reinforcing bar lattice 3, 4, to resonate the electromagnetic waves at a target frequency inside the RC wall 1.

Figure 11:
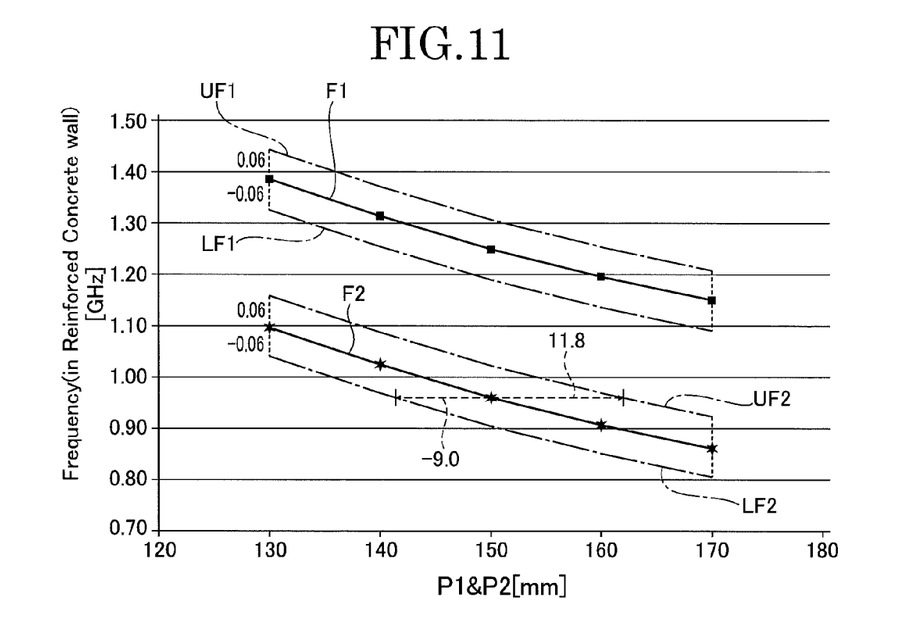
FIG. 11 is a graph showing a relation between the bar spacings and the frequency of an electromagnetic wave which causes resonance in the reinforced concrete partitioning structure.

FIG. 11 is a graph with the lattice spacing (P1, P2) on the abscissa axis and the frequency at which the electromagnetic wave is reflected (resonated) in the RC wall 1 on the longitudinal axis. In FIG. 11 the frequency graph F1 shows a relation between frequency and lattice spacing when the electromagnetic wave is reflected in the RC wall 1 in the distance D1 cover thickness C1+bar diameter B1). Also, the frequency graph F1 can be used when the electromagnetic wave is reflected in the cover thickness C2+bar diameter B2. For example, it can be understood from the frequency graph F1 that to resonate the electromagnetic wave at frequency of 1.25 GHz, the lattice spacing (P1, P2) has to be set to 150 mm.

Further, the frequency graph F2 shows a relation between frequency and lattice spacing when the electromagnetic wave is reflected in the distance D2 between the reinforcing bar plane 30 of the front reinforcing bar lattice 3 and the rear surface 12. The frequency graph F2 can be also used when the electromagnetic wave is reflected in the distance (cover thickness C1+bar diameter B1+distance C3) between the reinforcing bar plane 40 of the rear reinforcing bar lattice 4 and the front surface 11. For example, it can be understood from the frequency graph F2 that to resonate the electromagnetic wave at frequency of 0.96 GHz, the lattice spacing (P1, P2) has to be set to 150 mm.

Meanwhile, it is possible to attain the electromagnetic wave shielding effect the target frequency in a predetermined permissive error range, using the frequency graphs F1, F2. That is, as shown in FIG. 8, the electromagnetic wave shielding effect (SE) is attainable in the range of 1.20 GHz to 1.32 GHz around the frequency of 1.25 GHz. Then, (1.32−1.20)/2=0.06 GHz is obtained so that 0.06 GHz more and less than the target frequency is set to the permissible error range.

In FIG. 11 the upper and lower limits of the permissible error are indicated by the dashed-dotted lines UF1, LF1 (UF2, LF2) relative to the frequency graph F1 (F2). For example, to shield the electromagnetic wave at frequency of 0.96 GHz, the lattice spacing (P1, P2) can be set to from (150−9.0)=141 mm to (150+11.8)=161.8 mm.

Figure 12:
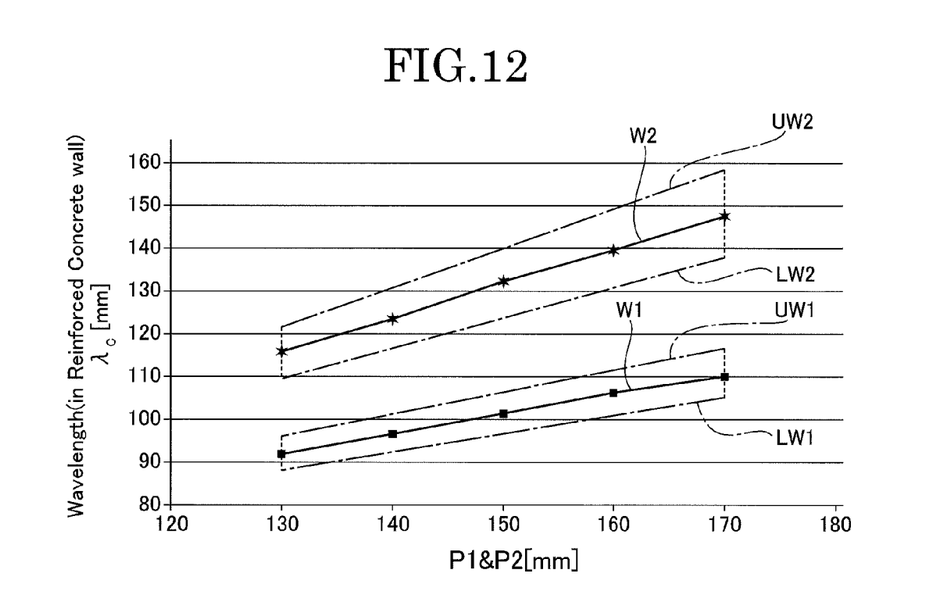
FIG. 12 a graph showing a relation between the bar spacings and the wavelength of the electromagnetic wave which causes resonance in the reinforced concrete partitioning structure.

FIG. 12 shows a relation between the wavelength $\lambda_c$ of the electromagnetic wave in the RC wall 1 and the lattice spacing (P1, P2) converted from the relation between the frequency and lattice spacing in FIG. 11. In FIG. 12 the wavelength $\lambda_c$ is on the longitudinal axis and the lattice spacing (P1, P2) is on the abscissa axis. Herein, the wavelength $\lambda_c$ of the concrete portion 2 in the RC wall 1 can be calculated by the following formula:

$$\lambda_c = v/f_c \times 1/\sqrt{\epsilon_r} \quad \text{(formula 0)}$$

where $\epsilon_r$ is the relative permittivity of the concrete portion 2, $f_c$ is the frequency of the electromagnetic wave, and v is the speed of light.

It can be seen from the wavelength graph W1 converted from the frequency graph F1 by the formula 0 that at the lattice spacing being 150 mm, the wavelength $\lambda_c$ is 101 mm. A half wavelength thereof is 50.5 mm. Meanwhile, the distance D1 is calculated from the cover thickness C1 (=40 mm) when the electromagnetic wave shielding effect (SE) at frequency of 1.25 GHz becomes maximal. It is such that cover thickness C1+bar diameter B1=40 mm+10 mm=50 mm, as shown in FIG. 9. Thus, the distance D1 is approximately equal to the half wavelength of 50.5 mm.

Moreover, the wavelength graph W1 is expressed by the following relation:

$$\lambda_c = 0.4685P + 30.937 \quad \text{(formula 1)}$$

where the lattice spacing P=P1=P2.

Thus, the lattice spacing P required for making the front reinforcing bar lattice 3 be the semi-transmissive plane can be obtained by substituting the wavelength $\lambda_c$ of an arbitrary target frequency $f_c$ into the above formula 1. Furthermore, the upper and lower graphs UW1, LW1 as the permissible error range of the wavelength graph W1 can be expressed by the following formulas:

$$\lambda_c = 0.5167P + 28.816 \quad \text{(formula 1U)}$$

$$\lambda_c = 0.4267P + 32.559 \quad \text{(formula 1L)}$$

For example, at the lattice spacing being 150 mm, the electromagnetic wave with a wavelength $\lambda_c$ in a range of 96.6 mm to 106.3 mm can cause a quasi-resonance phenomenon.

Moreover, to maximize the electromagnetic wave shielding effect of the front reinforcing bar lattice 3, the distance D1 which is the cover thickness C1 of the front reinforcing bar lattice 3 plus the bar diameter B1 has to be adjusted to the half wavelength $0.5\lambda_c$. Also, with not only first order but second, third . . . n-th order resonance taken into account, it can be generalized that the distance D1 should be adjusted to (integral multiple of wavelength−half wavelength)=$n\lambda_c - 0.5\lambda_c$ (n being integer). In addition, the distance as the cover thickness C2 of the rear reinforcing bar lattice 4 plus the bar diameter B2 can be adjusted on the basis of the integral multiple of wavelength−half wavelength ($0.5\lambda_c$).

Further, as shown in FIG. 9, the electromagnetic wave shielding effect (SE) reached the peak when the frequency is 1.25 GHz and the cover thickness C1=40 mm. It was still attained when the cover thickness C1 is less or more by 20 mm. Accordingly, the predetermined permissible errors in the position along the thickness can be set to a value less or more than a reference value by 20 mm.

Meanwhile, it can be seen from the wavelength graph W2 converted from the frequency graph F2 by the formula 0 that the wavelength $\lambda_c$ is 132 mm at the lattice spacing of 150 mm. From FIG. 9, the distance D2 is calculated from the cover thickness C1 (=60 mm) when the shielding effect (SE) for the electromagnetic wave at frequency of 0.96 GHz is maximal, to be the thickness C of the RC wall 1−(cover thickness C1+bar diameter B1)=200 mm−(60 mm+10 mm)=130 mm, which is approximately equal to the wavelength $\lambda_c$ of 132 mm described above.

Further, the wavelength W2 can be expressed by the following relation:

$$\lambda_c = 0.8056P + 10.59 \quad \text{(formula 2)}$$

where lattice spacing P=P1=P2.

Thus, the lattice spacing P required for making the front reinforcing bar lattice 3 be the semi-transmissive plane can be obtained by substituting, into the above formula 2, the wavelength $\lambda c$ of an arbitrary target frequency fc to be shield by the RC wall 1.

Furthermore, the upper and lower graphs UW2, LW2 as the permissible error range of the wavelength graph W2 can be expressed by the following relations:

$$\lambda_c = 0.9160P + 2.829 \quad \text{(formula 2U)}$$

$$\lambda_c = 0.7142P + 16.564 \quad \text{(formula 2L)}$$

For example, at the lattice spacing being 150 mm, the electromagnetic wave with a wavelength in a range $\lambda c$ of 123.7 mm to 140.2 mm can cause a quasi-resonance phenomenon.

Moreover, to maximize the electromagnetic wave shielding effect of the front reinforcing bar lattice 3, the distance D2 between the front reinforcing bar lattice 3 and the rear surface 12 has to be adjusted on the basis of the wavelength $\lambda_c$ or the integral multiple of wavelength $n\lambda_c$ (n being integer) with the n-th order resonance taken into account. Similarly to the above, the predetermined permissible errors in the position along the thickness can be set to a value less or more than a reference value by 20 mm.

Next, the operation of the reinforced concrete partitioning structure (RC wall 1) according to the present embodiment is described.

The thus-configured RC wall 1 according to the present embodiment is formed of the concrete portion 2 and the front reinforcing bar lattice 3 embedded into the concrete portion 2 and formed of the longitudinal bars 31, . . . and the transverse bars 32, . . . in lattice. Then, the spacings P1, P2 (lattice spacing P) of the transverse bars 32, 32 and the longitudinal bars 31, 31 are adjusted on the basis of the wavelength $\lambda_c$ of an electromagnetic wave with a target frequency $f_c$ for the purpose of attenuating the propagation of the electromagnetic wave with the target frequency $f_c$.

For example, the wavelength $\lambda_c$ of the target frequency $f_c$ to be shielded by the RC wall 1 is calculated by the above formula 0. Then, for attenuating the electromagnetic wave by the quasi-resonance phenomenon in the cover of the front or rear reinforcing bar lattice 3, 4, the lattice spacing P (P1, P2) of the front and rear reinforcing bar lattices 3, 4 is calculated by substituting the wavelength $\lambda_c$ of the target frequency $f_C$ into the above formula 0. Also, the lattice spacing P can be found using the wavelength graph W1 in FIG. 12.

Moreover, to operate the front reinforcing bar lattice 3 (or rear reinforcing bar lattice 4) as the semi-transmissive plane for electromagnetic waves, the position thereof along the thickness of the RC wall 1 is adjusted using the integral multiple of the wavelength $\lambda_c$–half wavelength. That is, the position of the reinforcing bar plane 30 of the front reinforcing bar lattice 3 along the thickness is adjusted to (cover thickness C1+bar diameter B1)=$n\lambda_c - 0.5\lambda_c$: n being integer).

Thus, the RC wall 1 built as a necessary structure can shield the electromagnetic waves at a target frequency $f_c$ by itself by only adjusting the lattice spacing P and the position of at least one of the front and rear reinforcing bar lattices 3, 4 in the thickness direction.

In particular the electromagnetic wave shielding effect can be improved by operating both of the front and rear reinforcing bar lattices 3, 4 as the semi-transmissive plane.

Meanwhile, for attenuating electromagnetic waves by the quasi-resonance phenomenon between the front reinforcing bar lattice 3 and the rear surface 12, the lattice spacing P (P1, P2) of the front reinforcing bar lattice 3 is found by the above formula 2 or the wavelength graph W2 in FIG. 12.

Moreover, to operate the front reinforcing bar lattice 3 as the semi-transmissive plane for the electromagnetic waves, the position thereof along the thickness of the RC wall 1 is adjusted by the integral multiple of the wavelength $\lambda_c$. That is, the front reinforcing bar lattice 3 is adjusted in position so that the distance D2 between the reinforcing bar plane 30 and the rear surface 12 is set to the integral multiple of the wavelength $\lambda_c$ ($n\lambda_c$: n being integer).

Thus, the RC wall 1 built as a necessary structure can shield the electromagnetic waves at a target frequency $f_C$ by itself by only adjusting the lattice spacing P and the position of the front reinforcing bar lattice 3 in the thickness direction.

That is, the RC wall 1 as thus configured can exert electromagnetic wave shielding function by only adjusting the spacings P1, P2 and the cover thicknesses C1, C2 of the reinforcing bars of a reinforced concrete wall built as a necessary structure. Because of this, the costs of materials can be reduced, compared with the related art which requires the attachment of an electromagnetic wave shielding member. Also, workload does not change from that for building a reinforced concrete wall alone. the RC wall 1 can be simply built without an additional work for adding the electromagnetic wave shielding function.

Buildings comprising such an RC wall 1 can be a data center, a server room, a broadcast studio, a photo studio, a radar flight control at airport, a wireless LAN usable office, and an electromagnetic wave shielding room and so on.

Further, this RC wall 1 exerts high electromagnetic wave shielding effect (SE) on the target frequency $f_c$ while allowing electromagnetic waves at frequency other than the target frequency to transmit therethrough. Accordingly, it can shield only the electromagnetic waves at specific frequency when the radio waves of a mobile phone need to be received inside a building but those of a wireless LAN cannot be leaked to outside.

Furthermore, this target frequency is not limited to a single frequency. As shown in FIG. 8, for example, in one or more embodiments, the two frequencies as 1.25 GHz and 0.96 GHz in particular can be effectively attenuated.

Moreover, this RC wall 1 can be directly built at a building site. The RC wall 1 can be also assembled at a building site using a precast panel which is manufactured in a factory or work yard in advance.

It is possible to accurately, stably place the front and rear reinforcing bar lattices 3, 4 with precise lattice spacing P in manufacturing a precast panel at factory or the like. It is also possible to form the concrete portion 2 in accurate thickness so that the RC wall 1 having a electromagnetic wave shield function can be built with stable quality.

First Example

Next, another example of a reinforced concrete partitioning structure as an RC wall 1A different from the above-described RC wall 1 is described. Note that the same terms and reference numbers used in the above embodiment will be used to refer to the same or like parts.

Figure 13:
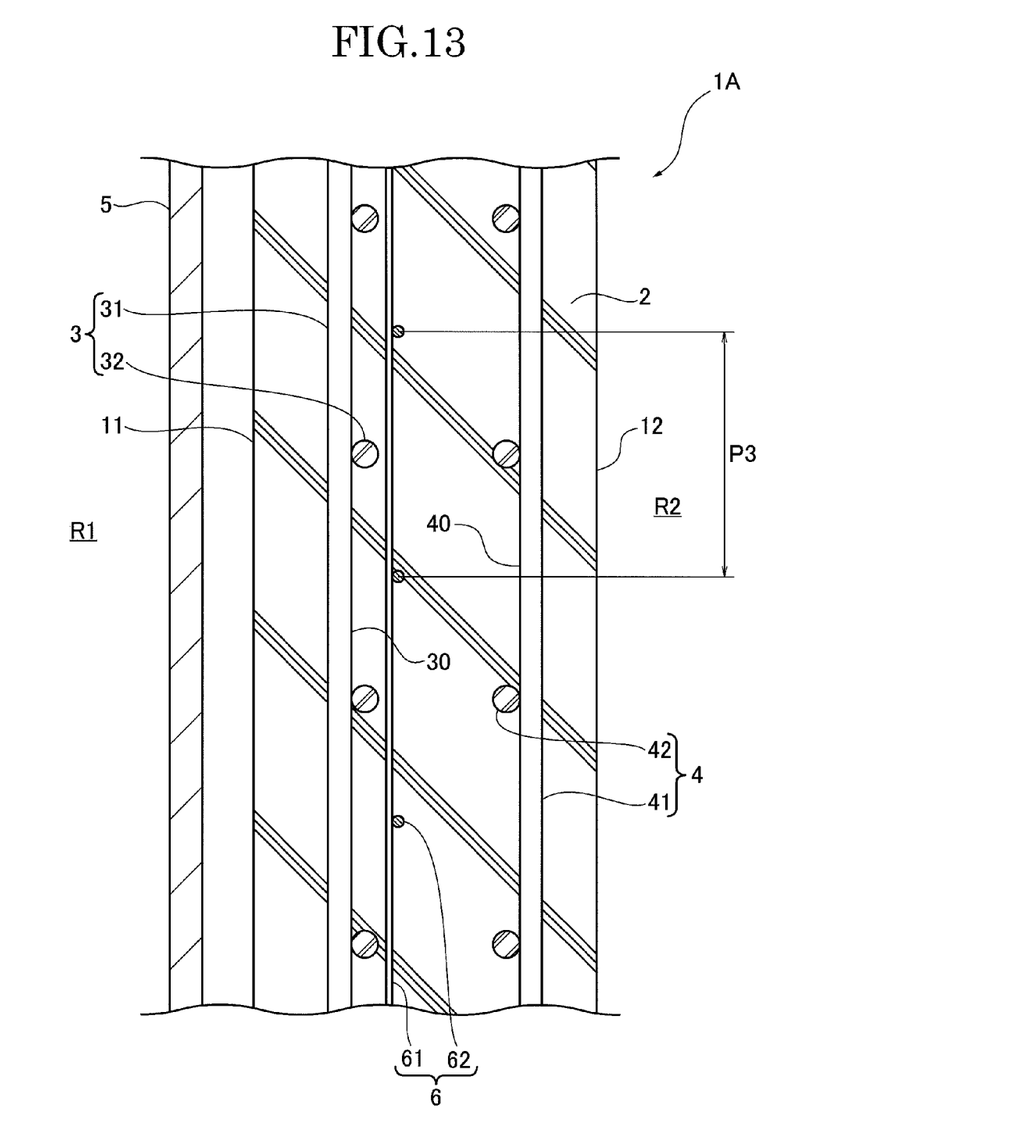
FIG. 13 is a cross section view of the structure of a reinforced concrete partitioning structure in a first example.

According to the RC wall 1A in the first example, a welded wire mesh 6 as a metal wire portion is embedded into the concrete portion 2 approximately in parallel to the front reinforcing bar lattice 3. The welded wire mesh 6 is formed of longitudinal wire rods 61, . . . vertically standing and transverse wire rods 62, . . . approximately intersecting the longitudinal wire rods 61 in lattice.

By adjusting a lattice spacing P3 between the transverse wire rods 62, 62 and the longitudinal wire rods 61, 61 approximately in parallel to the welded wire mesh 6, the welded wire mesh 6 can be a semi-transmissive plane for arbitrary frequency. Similarly to the lattice spacing (P1, P2) of the front reinforcing bar lattice 3 in the above embodiment, the magnitude of frequency for which the welded wire mesh 6 can operate as a semi-transmissive plane differs depending on the lattice spacing P3. Therefore, the wavelength $\lambda_{ck}$ of the target frequency $f_{ck}$ of an electromagnetic wave to be shielded by the welded wire mesh 6 is found by the above formula 0 to find the lattice spacing on the basis of the wavelength $\lambda_{ck}$ or using the formula 1 or 2 or FIG. 12.

The position of the welded wire mesh 6 along the thickness of the RC wall 1A can be determined according to the wavelength $\lambda_{ck}$ of the target frequency $f_{ck}$, as in the above embodiment. That is, for attenuating the electromagnetic wave by the resonance in the cover of the welded wire mesh 6, the distance between the front surface 11 and the welded wire mesh 6 is adjusted to the integral multiple of wavelength $\lambda_{ck}$–half wavelength=($n\lambda_{ck} - 0.5\lambda_{ck}$: n being integer).

Meanwhile, for attenuating the electromagnetic wave by the resonance between the welded wire mesh 6 and the rear surface 12, the distance between the welded wire mesh 6 and the rear surface 12 is adjusted to the integral multiple of the wavelength $\lambda_{ck}$.

Thus, by disposing the welded wire mesh 6 in addition to the front and rear reinforcing bar lattices 3, 4, the RC wall 1A can exert the electromagnetic wave shielding effect on the target frequencies $f_c$, $f_{ck}$.

Further, if the target frequency $f_c$ to be shielded by the front reinforcing bar lattice 3 and that $f_{ck}$ to be shielded by the welded wire mesh 6 are close values, the peak width will be increased due to two overlapping frequencies so that the bandwidth of shieldable frequencies can be widened.

The other configuration, operation, and effect of the first example are almost the same as those in the above embodiment and other examples, so that a description thereof is omitted.

Second Example

Next, another reinforcing bar portion different from the front and rear reinforcing bar lattices 3, 4 in one or more embodiments and first example is described. The same terms and reference numbers in the above embodiment and first example will be used to refer to the same or like parts.

Figure 14:
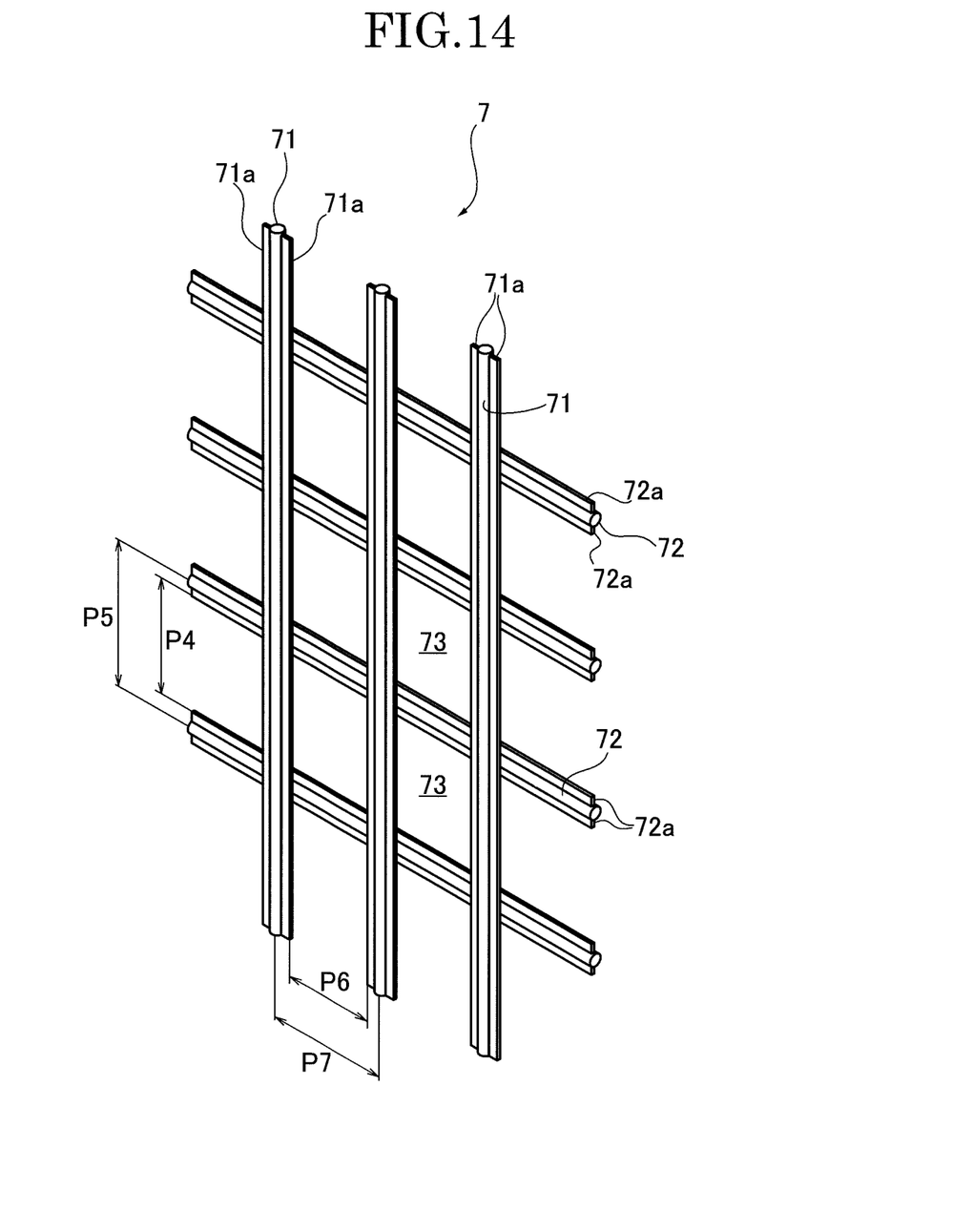
FIG. 14 is a perspective view of the structure of a reinforcing bar portion formed of reinforcing bars with extending widening portions in a second example.

FIG. 14 is a perspective view of a reinforcing bar lattice with blades 7 as a reinforcing bar portion in the second example. The reinforcing bar lattice with blades 7 is formed of longitudinal bars 71, . . . vertically standing as a first reinforcing bar and transverse bars 72, . . . as a second reinforcing bar intersecting the longitudinal bars 71 at about right angle in lattice. Each square of the longitudinal bars 71, 71 and the transverse bars 72, 72 is referred to as void 73.

Further, in FIG. 14 the longitudinal bars 71, each include blade portions 71a, 71a as a widening portion extending on both of the right and left sides. Specifically, the blade portions 71a, 71a are provided to face each other over the longitudinal bars 71. Also, the blade portions 71a, 71a are formed of a steel band plate adhered to the longitudinal bars 71 in longitudinal direction.

Likewise, the transverse bars 72 in FIG. 14 each include blade portions 72a, 72a as a widening portion extending on both of the upper and lower sides. Specifically, the blade portions 72a, 72a are provided to face each other over the transverse bars 72. Also, the blade portions 72a, 72a are each formed of a steel band plate adhered to the transverse bars 72 in longitudinal direction.

The longitudinal bars 71 and transverse bars 72 are intersected each other with the extending blade portions 71a, 72a positioned in a direction such that each void 73 of the lattice becomes smallest. Here, the projected area of the void 73 is smallest when the blade portions 71a, 72a of the reinforcing bar lattice with blades 7 are arranged in parallel.

Thus, with the blade portions 71a, 72a provided on the longitudinal bars 71 and the transverse bars 72, the lattice spacing can be regarded wider from spacing P4 between the blade portions 72a, 72a (or spacing P6 between the blade portions 71a, 71a) to spacing P5 between the transverse bars 72, 72 (or spacing P7 between the longitudinal bars 71, 71). The wider lattice spacing includes a plurality of lattice spacings and it means that the frequencies corresponding to the spacings can be resonated. In other words, the bandwidth of the target frequency to be able to be resonated can be widened by the blade portions 71a, 72a.

The RC walls 1, 1A including the thus-configured reinforcing bar lattice with blades 7 can shield electromagnetic waves at frequencies in a wider bandwidth and effectively shield electromagnetic waves in a wider range.

Further, the blade portions 71a, 72a have been described as a widening portion in the above. However, the widening portion should not be limited thereto. The widening portion can be formed of the longitudinal bars 71 and the transverse bars 72 around which a linear or tape-like steel is wound.

The other configuration, operation, and effect of the second example are almost the same as those in the above embodiment and other examples, so that a description thereof is omitted.

Third Example

Next, another concrete portion different from the concrete portion 2 in the above embodiment is described. The same terms and reference numbers used in the above embodiment and other examples will be used to refer to the same or like parts.

The concrete portion according to the third example is formed to exhibit improved electromagnetic wave absorption performance from one made from general concrete only.

For example, to heighten electromagnetic wave absorption performance, a concrete portion is formed by mixing a mixture such as electrically conductive powder or fiber or magnetic powder into concrete. Thereby, the concrete portion itself can absorb electromagnetic waves. Herein, carbon beads or metal powder in particle diameter of 1 to 500 μm can be used for the electrically conductive powder. Carbon fiber, silicon carbide fiber or metal fiber in diameter of 5 to 30 μm and length of 1 to 20 mm can be used for the electrically conductive fiber. Ferrite powder, titanium powder or magnetic powder in particle diameter of 3 to 500 μm can be used for the magnetic powder.

Also, it is possible to improve the electromagnetic wave absorption performance of the concrete portion by mixing air bubbles into concrete or using porous concrete.

The other configuration, operation, and effect of the third example are almost the same as those in the above embodiment and other examples, so that a description thereof is omitted.

Although the reinforced concrete partitioning structure according to one or more embodiments of the present invention has been described in terms of embodiment and examples, it is not limited thereto. It should be appreciated that variations, modifications or additions may be made in one or more embodiments and examples described by persons skilled in the art without departing from the scope of the one or more embodiments of the present invention.

For example, the above embodiment and examples have described an example where the RC walls 1, 1A are outer walls to separate the inner space R1 and the outer space R2. However, the present invention is not limited thereto. One or more embodiments of the present invention is applicable to a partition wall in inner space. Further, it should not be limited to walls and a floor or ceiling can be a reinforced concrete partitioning structure according to one or more embodiments of the present invention.

Furthermore, the above embodiment has described an example where electromagnetic waves are propagated from the inner space R1 to the outer space R2. However, the present invention is not limited thereto. The reinforcing bar portions can be arranged in the same manner to shield target electromagnetic waves which propagate from the outer space R2 to the inner space R1.

Further, although not provided in the above embodiment, an electromagnetic wave shielding member such as iron plate, metal net, metallic foil, metal mesh, ferrite material can be additionally provided between the interior plate 5 and the RC wall 1 to improve the electromagnetic wave shielding effect.

Moreover, the above embodiment and examples have described an example where the transverse bars 32 of the front reinforcing bar lattice 3 are placed closer to the rear surface 12 of the RC wall 1 relative to the longitudinal bars 31. However, the present invention is not limited thereto. The transverse bars 32 can be placed closer to the front surface 11 of the RC wall 1 relative to the longitudinal bar 31. Likewise, the transverse bars 42 of the rear reinforcing bar lattice 4 can be placed closer to the rear surface 12 of the RC wall 1 relative to the longitudinal bars 41.

Moreover, the above embodiment and examples have described the RC walls 1, 1A which comprise both of the front and rear reinforcing bar lattices 3, 4. However, the present invention is not limited thereto. A single layer reinforced concrete partitioning structure including either of the front and rear reinforcing bar lattices 3, 4 can exert the electromagnetic wave shielding effect.

Furthermore, the above embodiments and examples have described an example where the longitudinal bars 31 and the transverse bars 32 are orthogonal to each other. However, the present invention is not limited thereto. The first and second reinforcing bars can be intersected at an angle other than right angle. Also, the first and second reinforcing bars can be diagonally arranged instead of vertically or horizontally.

The invention claimed is:

1. A reinforced concrete partitioning structure to attenuate an electromagnetic wave having a target frequency which propagates from one space to the other space, comprising:
   a concrete portion having a thickness in a direction of the one space to the other space; and
   a reinforcing bar portion to form a reinforcing bar plane in lattice at a position in the thickness direction of the concrete portion, and including a plurality of first reinforcing bars and a plurality of second reinforcing bars to intersect the first reinforcing bars, the first and second reinforcing bars arranged with a fixed lattice spacing, wherein
   the lattice spacing of the first and second reinforcing bars are adjusted according to a wavelength or frequency of the electromagnetic wave having the target frequency; and
   the lattice spacing of the first and second reinforcing bars are set to a reference value with a predetermined permissible range of error according to a wavelength of the target frequency of the electromagnetic wave propagating through the concrete portion, wherein the reference value satisfies the following expression:

the wavelength $\lambda_c=0.4685P+30.937$ where P is the lattice spacing of the first and second reinforcing bars, the predetermined permissible range of error being defined by an upper limit value expressed by $\lambda_c=0.5167P+28.816$ and a lower limit value expressed by $\lambda_c=0.4267P+32.559$.

2. A reinforced concrete partitioning structure according to claim 1, wherein
   the lattice spacing of the first and second reinforcing bars are adjusted according to a frequency of an electromagnetic wave which causes resonance inside the concrete portion.

3. A reinforced concrete partitioning structure according to claim 1, wherein
   the target frequency is a plurality of frequencies.

4. A reinforced concrete partitioning structure according to claim 1, wherein
   a number of the reinforcing bar portion is plural and provided with a spacing in the thickness direction.

5. A reinforced concrete partitioning structure according to claim 1, wherein
   the concrete portion includes a metal wire portion in lattice form embedded therein.

6. A reinforced concrete partitioning structure according to claim 1, further comprising
   the first and second reinforcing bars each include a widening portion to extend in a direction to narrow a void of the lattice.

7. A reinforced concrete partitioning structure according to claim 1, wherein
   the concrete portion is mixed with a mixture or an air bubble to improve electromagnetic wave absorption performance.

8. A reinforced concrete partitioning structure according to claim 1, wherein
   the reinforced concrete partitioning structure is formed in a panel.

9. A reinforced concrete partitioning structure to attenuate an electromagnetic wave having a target frequency which propagates from one space to the other space, comprising:
   a concrete portion having a thickness in a direction of the one space to the other space; and
   a reinforcing bar portion to foam a reinforcing bar plane in lattice at a position in the thickness direction of the concrete portion, and including a plurality of first reinforcing bars and a plurality of second reinforcing bars to intersect the first reinforcing bars, the first and second reinforcing bars arranged with a fixed lattice spacing, wherein
   the lattice spacing of the first and second reinforcing bars are adjusted according to a wavelength or frequency of the electromagnetic wave having the target frequency; and
   the position of the reinforcing bar portion in the thickness direction is set according to an integral multiple of a wavelength of the target frequency inside the concrete portion or a wavelength obtained by subtracting a half wavelength from the integral multiple of the wavelength,
   wherein the lattice spacing of the first and second reinforcing bars are set to a reference value with a predetermined permissible range of error according to a wavelength $\lambda_c$ of the target frequency of the electromagnetic wave propagating through the concrete portion, wherein the reference value satisfies the following expression:

$\lambda_c=0.4685P+30.937$ where P is the lattice spacing of the first and second reinforcing bars, the predetermined permissible range of error being defined by an upper limit value expressed by $\lambda_c=0.5167P+28.816$ and a lower limit value expressed by $\lambda_c=0.4267P+32.559$.

10. A reinforced concrete partitioning structure according to claim 9, wherein
    a number of the reinforcing bar portion is plural and provided with a spacing in the thickness direction.

11. A reinforced concrete partitioning structure according to claim 9, wherein
    the concrete portion includes a metal wire portion in lattice form embedded therein.

12. A reinforced concrete partitioning structure according to claim 9, further comprising
    the first and second reinforcing bars each include a widening portion to extend in a direction to narrow a void of the lattice.

13. A reinforced concrete partitioning structure according to claim 9, wherein
    the concrete portion is mixed with a mixture or an air bubble to improve electromagnetic wave absorption performance.

14. A reinforced concrete partitioning structure according to claim 9, wherein
    the reinforced concrete partitioning structure is formed in a panel.

15. A reinforced concrete partitioning structure to attenuate an electromagnetic wave having a target frequency which propagates from one space to the other space, comprising:
    a concrete portion having a thickness in a direction of the one space to the other space; and a reinforcing bar portion to form a reinforcing bar plane in lattice at a position in the thickness direction of the concrete portion, and including a plurality of first reinforcing bars and a plurality of second reinforcing bars to intersect the first reinforcing bars, the first and second reinforcing bars arranged with a fixed lattice spacing, wherein the lattice spacing of the first and second reinforcing bars are adjusted according to a wavelength or frequency of the electromagnetic wave having the target frequency; and the position of the reinforcing bar portion in the thickness direction is set to a value in a predetermined permissible error range of ±20 mm from a reference value as an integral multiple of a wavelength of the target frequency inside the concrete portion or as a wavelength obtained by subtracting a half wavelength from the integral multiple of the wavelength, wherein the lattice spacing of the first and second reinforcing bars are set to a reference value with a predetermined permissible range of error according to a wavelength $\lambda_c$ of the target frequency of the electromagnetic wave propagating through the concrete portion, wherein the reference value satisfies the following expression:

$\lambda_c = 0.4685P + 30.937$ where P is the lattice spacing of the first and second reinforcing bars, the predetermined permissible range of error being defined by an upper limit value expressed by $\lambda_c = 0.5167P + 28.816$ and a lower limit value expressed by $\lambda_c = 0.4267P + 32.559$.

16. A reinforced concrete partitioning structure according to claim 15, wherein a number of the reinforcing bar portion is plural and provided with a spacing in the thickness direction.

17. A reinforced concrete partitioning structure according to claim 15, wherein the concrete portion includes a metal wire portion in lattice form embedded therein.

18. A reinforced concrete partitioning structure according to claim 15, further comprising the first and second reinforcing bars each include a widening portion to extend in a direction to narrow a void of the lattice.

19. A reinforced concrete partitioning structure according to claim 15, wherein the concrete portion is mixed with a mixture or an air bubble to improve electromagnetic wave absorption performance.

20. A reinforced concrete partitioning structure according to claim 15, wherein the reinforced concrete partitioning structure is formed in a panel.

* * * * *